United States Patent
Rho

(10) Patent No.: US 7,123,531 B2
(45) Date of Patent: Oct. 17, 2006

(54) DIFFERENTIAL AMPLIFIER AND BIT-LINE SENSE AMPLIFIER ADOPTING THE SAME

(75) Inventor: Kwang Myoung Rho, Kyungki-Do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/144,129

(22) Filed: Jun. 3, 2005

(65) Prior Publication Data

US 2005/0219925 A1    Oct. 6, 2005

Related U.S. Application Data

(62) Division of application No. 10/742,314, filed on Dec. 19, 2003, now abandoned.

(30) Foreign Application Priority Data

Oct. 2, 2003   (KR) .............................. 2003-68582

(51) Int. Cl.
  *G11C 7/02*    (2006.01)
(52) U.S. Cl. ................. 365/208; 365/189.05; 365/205; 365/207; 327/51; 327/57
(58) Field of Classification Search .................... None
  See application file for complete search history.

(56) References Cited

U.S. PATENT DOCUMENTS

| 5,434,821 | A | * | 7/1995 | Watanabe et al. ............ 365/203 |
| 6,037,807 | A | * | 3/2000 | Wu et al. ...................... 327/52 |
| 6,466,501 | B1 | * | 10/2002 | Kim et al. .................... 365/207 |
| 6,914,836 | B1 | * | 7/2005 | Jeon et al. ................... 365/205 |

* cited by examiner

*Primary Examiner*—Amir Zarabian
*Assistant Examiner*—Kretelia Graham
(74) *Attorney, Agent, or Firm*—Marshall, Gerstein & Borun LLP

(57) ABSTRACT

A bit-line sense amplifier is disclosed that includes switching elements to sequentially modify the sense amplifier to a negative feedback differential amplifier, a normal differential amplifier, a positive feedback differential amplifier, and a cross-coupled latch, in that order. The sense amplifier sensing data on a pair of bit-lines in a semiconductor memory; and a transistor is connected between one of the differential amplifiers and a common current source. The transistor has a resistance which is variable depending on a potential of an output of one of the differential amplifiers or remains constant by a different power source.

4 Claims, 9 Drawing Sheets

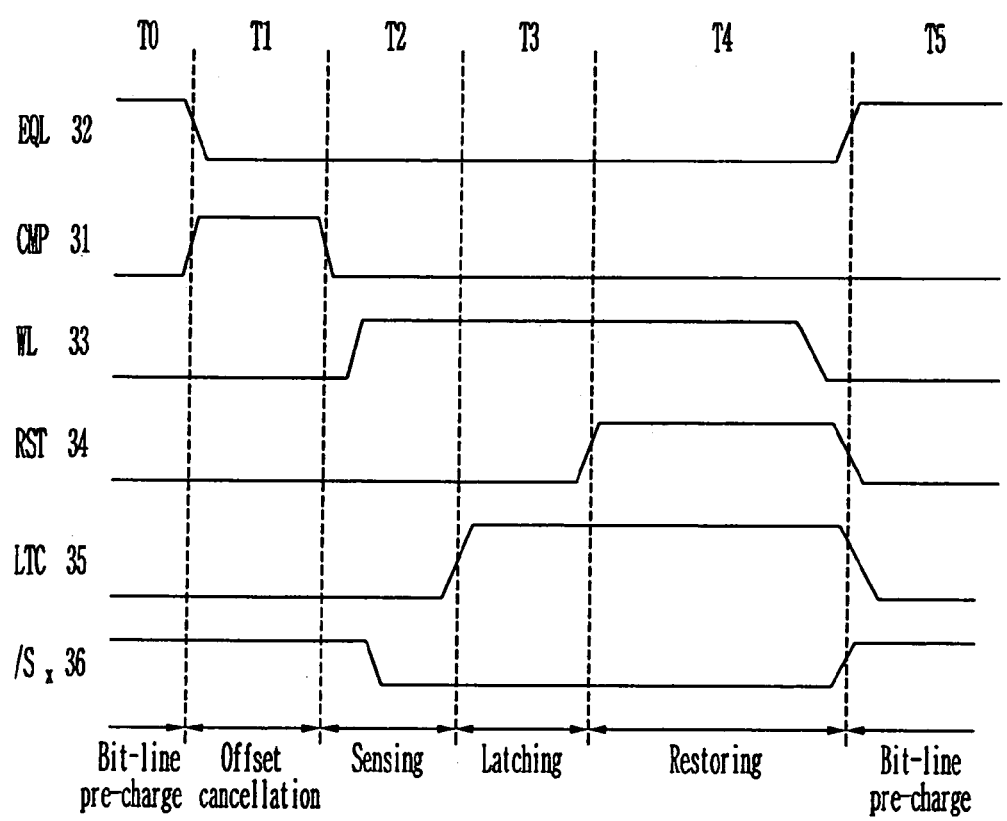

US 7,123,531 B2

DIFFERENTIAL AMPLIFIER AND BIT-LINE SENSE AMPLIFIER ADOPTING THE SAME

CROSS REFERENCE TO RELATED APPLICATIONS

This application is a Divisional of U.S. patent application Ser. No. 10/742,314 filed Dec. 19, 2003, now abandoned which claims priority from Korean Patent Application Serial No. 2003-68582 filed Oct. 2, 2003, which are incorporated herein by reference.

BACKGROUND

1. Technical Field of the Invention

The present invention relates to a bit-line sense amplifier for sensing and amplifying data in a semiconductor memory to output them and, more particularly, to a bit-line sense amplifier capable of modifying an amplification method in a sequential manner by using switching elements controlled by switching control signals to compensate an offset voltage of the sense amplifier.

2. Discussion of Related Art

Typically, a bit-line sense amplifier senses and amplifies data on a bit-line to output them on a data bus, and a data bus sense amplifier senses and amplifies the data amplified by the bit-line sense amplifier again to output them to a data output buffer. Usually, a cross-coupled latch type amplifier is used as the bit-line sense amplifier.

Now, operations of the typical bit-line sense amplifier will be described with reference to FIG. 1 as follows. First, transistors Q1 to Q3 are turned on depending on a bit-line precharge signal BLP, so that bit-lines Bit and /Bit are precharged by a precharge voltage (e.g., $V_{BLP}$). As a result, the bit-line Bit connected to a selected memory cell and a complementary bit-line /Bit are equalized.

A row decoder analyzes a row address input from the external to select a word-line corresponding to the row address. Then, a cell transistor connected to the selected word-line is turned on, so that a potential difference occurs between the bit-line Bit connected to the selected memory cell and the complementary bit-line /Bit, while charge sharing occurs between a cell capacitance and a bit-line capacitance.

At this moment, when a sense amplifier control signals RTO and /S are enabled, a sense amplifier control signal is at a high level. When a sense amplifier control signal /S is at a low level, a bit-line sense amplifier operates to sense the potential difference between the bit-line Bit and the complementary bit-line /Bit and then amplify it.

For example, when the data stored in a selected memory cell corresponds to a low level data, the potential of the bit-line Bit connected to the selected cell comes to be lower than the precharge voltage, and the potential of the bit-line /Bit which is not connected to the selected cell remains at a precharge voltage, thereby generating a potential difference between two bit-lines.

Consequently, in the bit-line sense amplifier corresponding to a cross-coupled latch type amplifier, the transistors Q5 and Q6 are turned on, while the transistors Q4 and Q7 are turned off, so that the bit-line Bit connected to the selected memory cell is at a low level by the sense amplifier control signal /S. On the other hand, the complementary bit-line /Bit is at a low level by the sense amplifier control signal RTO.

Subsequently, a column address is analyzed by a column decoder, and then the data on the bit-line amplified by the bit-line amplifier are sent to a data bus if a column control signal corresponding to the column address is enabled at a high level.

Nevertheless, if such a sense amplifier in a conventional semiconductor memory device operates at a lower voltage, a safe operation cannot be ensured when the data on the bit-line are sensed by the offset voltage between the bit-line and the sense amplifier. Therefore, there have been problems such as excessive time consumption to sufficiently amplify the data on the bit-line.

This is because, if the bit-line sense amplifier operates at a lower voltage, the amount of charges stored in a memory cell can be reduced, so that the potential difference between the bit-line connected to a memory cell and the complementary bit-line is reduced during the charge sharing.

As a consequence, when a bit-line sense amplifier senses a small potential difference between the bit-line connected to the selected memory cell and the complementary bit-line, the sense amplifier can operate slower because the potential difference is almost the same as the offset voltage. Furthermore, data errors can occur because the data can be incorrectly sensed if the difference is smaller than the offset voltage.

FIG. 2 shows a conventional bit-line sense amplifier for solving the above problems, and will be described with reference to FIG. 3.

A time period T0 in FIG. 3 is a preparation stage for driving a sense amplifier. In the time period T0, a precharge signal BLP is enabled at a high level before a semiconductor memory device performs a read or a write operation, so that transistors NM4 and NM5 are turned on. As a result, the bit-lines BL and /BL are precharged by a precharge voltage VBLP.

In addition, in order to eliminate a voltage difference between the bit-lines BL and /BL, an equalization control signal EQ is enabled at a high level, so that a transistor NM1 is turned on and the bit-lines BL and /BL are interconnected to be equalized. At this moment, a sense amplifier control signal /S is also precharged by the precharge voltage VBLP according to the same method.

During the time periods T1 to T4, a sense amplifier 40 is enabled. In addition, the sense amplifier 40 is sequentially modified in each time period depending on the control signals CONA, CONB, and CONC, so as to be a negative feedback differential amplification scheme in a time period T1, a normal differential amplification scheme in a time period T2, a positive feedback differential amplification scheme in a time period T3, and a cross-coupled latch type amplification scheme in a time period T4 in that order.

In the time period T1, the precharge control signal BLP is disabled at a low level and the sense amplifier control signal /S is enabled at a low level, so that the sense amplifier 40 begins to operate. At this moment, since the switching control signals CONA and CONB are at a low level, the PMOS transistor PM3 is turned on, so that the gate of the PMOS transistor PM1 is commonly connected to the drain. As a result, the sense amplifier 40 constitutes a differential amplifier.

In addition, since a switching control signal CONC is at a high level, the NMOS transistor NM13 is turned on, so that the complementary bit-line line /BL corresponding to the inverted input terminal of the sense amplifier 40 is connected to the drain to which the PMOS transistor PM2 corresponding to an output terminal of the sense amplifier 40 and the NMOS transistor NM9 are commonly connected. As a result, the sense amplifier 40 constitutes a negative feedback differential amplifier. Accordingly, the potential of the complementary bit-line /BL is adjusted to a voltage capable of compensating the offset voltage of the sense amplifier 40.

Subsequently, in the time period T2, the switching control signal CONC is at a low level, so that the NMOS transistor NM13 is turned off, and all other switching control signals CONA and CONB remain at a low level. As a result, the sense amplifier 40 constitutes a normal differential amplifier. At this moment, the word-line WL is enabled, so that the data stored in the selected memory cell is loaded on the bit-line BL. Therefore, the data on the bit-line BL are sensed and amplified by the normal differential amplifier.

In the time period T1, because the offset voltage of the. differential amplifier has been compensated, even though a small amount of signal voltage is applied to the bit-line BL, it can be rapidly sensed and amplified by the differential amplifier.

Subsequently, in the time period T3, the switching control signal CONB comes to be a high level, and the NMOS transistor NM11 is turned on, so that the bit-line BL corresponding to the non-inverted input terminal of the sense amplifier 40 is connected to the drain to which the PMOS transistor PM2 corresponding to an output terminal of the sense amplifier 40 and the NMOS transistor NM9 are commonly connected, while other switching control signals CONA and CONC remain at a low level. As a result, the sense amplifier 40 constitutes a positive feedback differential amplifier. For this reason, the data on the bit-line BL is converted to a large intensity of signal by the action of the positive feedback differential amplifier.

Subsequently, in the time period T4, the switching control signal CONA is at a high level, so that the PMOS transistor PM3 is turned off, and the NMOS transistors NM10 and NM12 are turned on. In addition, the switching control signal CONB is at a high level so that the NMOS transistor NM11 is turned on, while the switching control signal CONC remains at a low level so that the NMOS transistor NM13 remains to be turned off. As a result, the sense amplifier 40 constitutes a cross-coupled latch. Therefore, it is possible to rapidly latch the data that have been amplified in the previous stage T3. At this moment, the column selection signal YI is enabled to be at a high level, so that the latched data are output to the data buses DB and /DB.

Among the above processes, the mechanism of the offset voltage compensation in the time period T1 will be described in detail as follows. That is, the bit-line sense amplifier in FIG. 2 is temporarily modified to be a differential amplifier as shown in FIG. 4A, in the time period T1. At this moment, the offset voltage can be compensated by shorting input/output terminals of the differential amplifier for a predetermined time period. The operation of such a differential amplifier will be described in detail with reference to FIGS. 4A and 4B.

When an inverted (−) input terminal and the output of the differential amplifier are shorted in an instant, the differential amplifier is modified to operate as a negative feed back differential amplifier and function in such a way that the input offset voltage can be cancelled. If a voltage gain of the differential amplifier is sufficiently large, the differential voltage between the input terminals becomes an input offset voltage of the differential amplifier in a predetermined time after the shorting, so that offset compensation can be achieved and its sensitivity can be improved.

However, as a wafer scaling progresses to improve integrity, the output resistance of the MOSFET is reduced, and the voltage gain of the differential amplifier is also reduced correspondingly.

If the voltage gain A of the differential amplifier is not sufficiently large, the offset compensation effect of the bit-line sense amplifier is significantly affected by the difference between the precharge level (Vin, typically ½ VDD) of a differential input amplifier and the output voltage level Vo of a differential amplifier with no offset.

A residual offset after the offset compensation in the bit-line sense amplifier can be expressed by the following equation;

$$V_{offe} = \frac{V_{off} + V_{in} - V_o}{1 + A} \qquad \text{[Equation 1]}$$

FIG. 5 shows a residual offset voltage according to a voltage gain of the differential amplifier and an output voltage level of the differential amplifier. It is possible to recognize that the residual offset can be considerably large depending on the difference between the output voltage level and the input voltage level. For example, if the voltage gain is set to 10, the difference between the input voltage and the output voltage is set to 200 mV, and an original input offset voltage is set to 50 mV, the residual offset voltage becomes 23 mV, so that 45% of the original offset voltage still remains to be not compensated.

For another example showing the residual offset voltage problem, FIG. 6 is a graph showing bit-line signal components in a variety of configurations and array arrangements. The bit-line signals are composed of an effective read signal A, a residual offset voltage B, and a charge noise C. As seen from FIG. 6, the residual offset voltage based on design conditions is set to about 10 to 20 mV, and the original offset voltage is set to 40 mV, which correspond to 25 to 50% of the bit-line signals.

Accordingly, in order to reduce the residual offset voltage and maximize the offset compensation effect, the output voltage level of the differential amplifier should be designed to correspond with the precharge level of the differential input. However, the output voltage level of the differential amplifier is affected by the threshold voltage variations in the input NMOS transistor or the PMOS transistor, and geometrical variations in the channel length or width, thereby causing inconsistency with the design values. The variation on the output voltage caused by such process variations significantly affects the residual offset voltage of the bit-line sense amplifier.

Such a variation on the output voltage in the differential amplifier will be described with reference to FIGS. 7 and 8 as follows.

The differential amplifier comprises PMOS transistors P1 and P2 and NMOS transistors N1, N2, and N3, which constitute a current mirror. The PMOS transistors P1 and P2 correspond to active resistors, and the NMOS transistor N3 corresponds to a current source. When an identical voltage is applied to the input terminals IN and /IN, in case of an ideal differential amplifier, the current through the NMOS transistor N1 becomes identical to that through the NMOS transistor N2.

The curve C1 in FIG. 8 designates a current driving capability of the PMOS transistor based on design values, and the curve C2 designates a current driving capability of the PMOS transistor based on a practical case. As shown in the graph, the practical current driving capability of the PMOS transistor is lower than that of the design values due to process variations. This causes a variation on the output voltage level. In other words, despite the fact that the output voltage should reach Vo2 according to the design value, the output voltage remains at Vo1 which is lower than Vo2 due to the variation on the current driving capability.

SUMMARY OF THE INVENTION

Accordingly, the present invention is directed to provide a differential amplifier capable of maintaining a constant output voltage level irrespective of the variation on the current driving capability.

In addition, the present patent is directed to use a differential amplifier capable of maintaining a constant output voltage level irrespective of the variation on the current driving capability as a bit-line sense amplifier in order to compensate the offset voltage.

One aspect of the patent is to provide a differential amplifier having a load connected between a voltage source, a first and a second output terminal; a first transistor connected between the first output terminal and a first node. The differential amplifier also includes a third transistor that is turned on depending on a first input signal; a second transistor connected between the second output terminal and the first node, wherein the second transistor is turned on depending on a second input signal. A MOSFET resistor is also included and is connected between the first node and a second node. The MOSFET resistor has a resistance which is variable depending on a potential of the first output terminal or the second output terminal. Also included is a common current source connected to the second node.

In addition, according to the first embodiment of another aspect, a bit line sense amplifier includes switching elements for sequentially modifying the sense amplifier to a negative feedback differential amplifier, a normal differential amplifier, a positive feedback differential amplifier, and a cross-coupled latch, in that order. The sense amplifier senses data on a pair of bit-lines in a semiconductor memory. Also includes is a transistor connected between the differential amplifiers and a common current source, wherein the transistor has a resistance which is variable depending on a potential of an output of one of the differential amplifiers or remains constant by a different power source.

According to a second aspect, a bit-line sense amplifier includes switching elements to sequentially modify a sense amplifier to operate as a negative feedback differential amplifier, a normal differential amplifier, and a cross-coupled latch, in that order, depending on control signals. The sense amplifier senses data on a pair of bit-lines in a semiconductor memory; and a restore means is included to rewrite the sensed data on the pair of bit-lines and a selected cell in the semiconductor memory. A transistor is connected between the differential amplifiers and a common current source, the transistor having a resistance which is variable depending on a potential of an output of one of the differential amplifiers or remains constant by a different power source.

BRIEF DESCRIPTION OF THE DRAWINGS

The aforementioned aspects and other features of the disclosed embodiments will be explained in the following description, taken in conjunction with the accompanying drawings, wherein:

FIG. 13 is a waveform chart for describing operations of the circuit in FIG. 12.

DETAILED DESCRIPTION OF PREFERRED EMBODIMENTS

Figure 1:
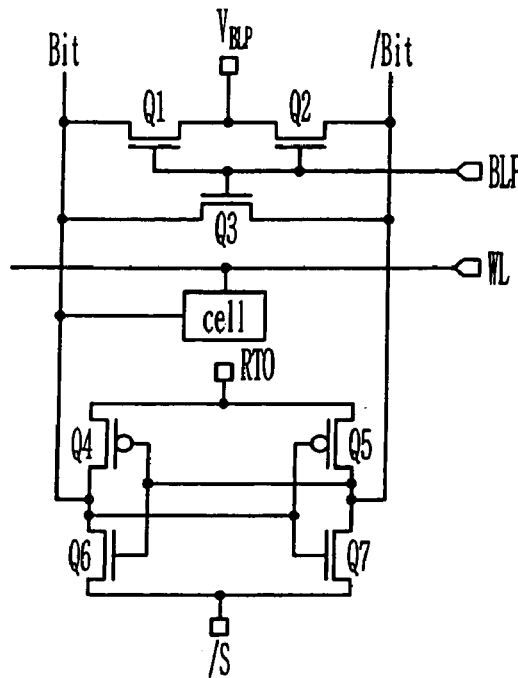
FIG. 1 is a circuit diagram of a conventional bit-line sense amplifier.
Figure 2:
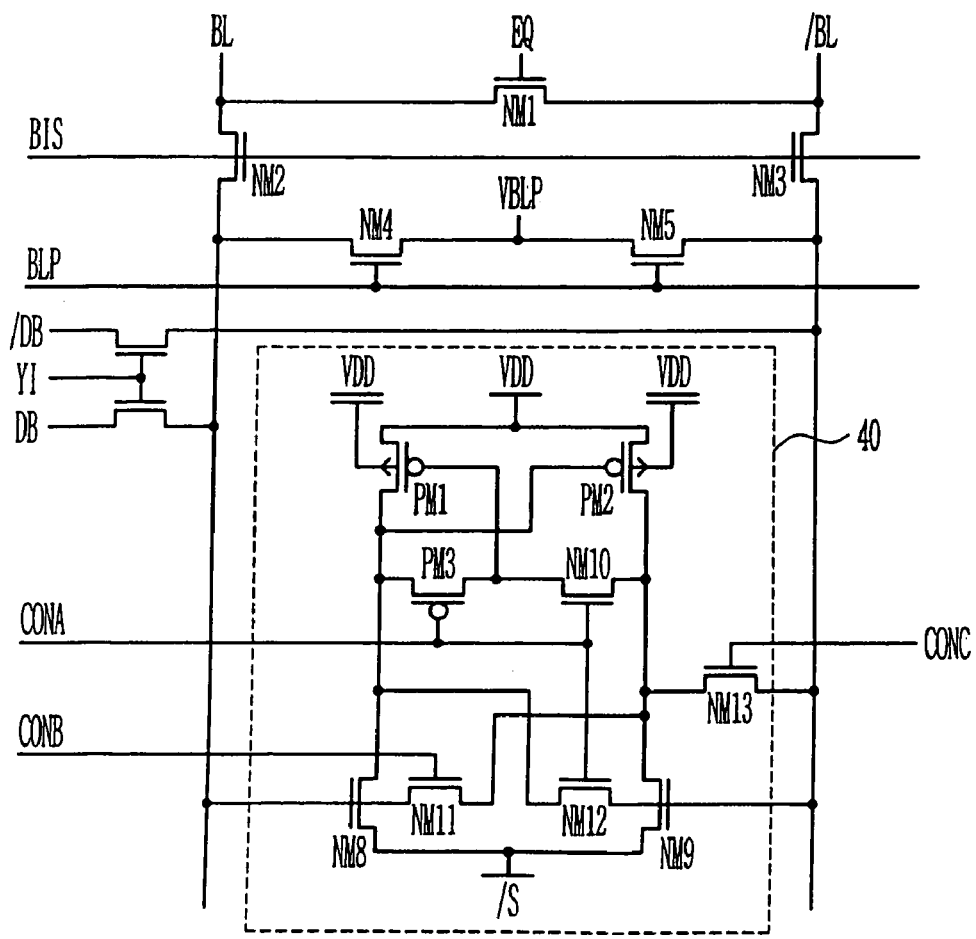
FIG. 2 is a circuit diagram of another conventional bit-line sense amplifier, which is upgraded from the circuit in FIG. 1.
Figure 3:
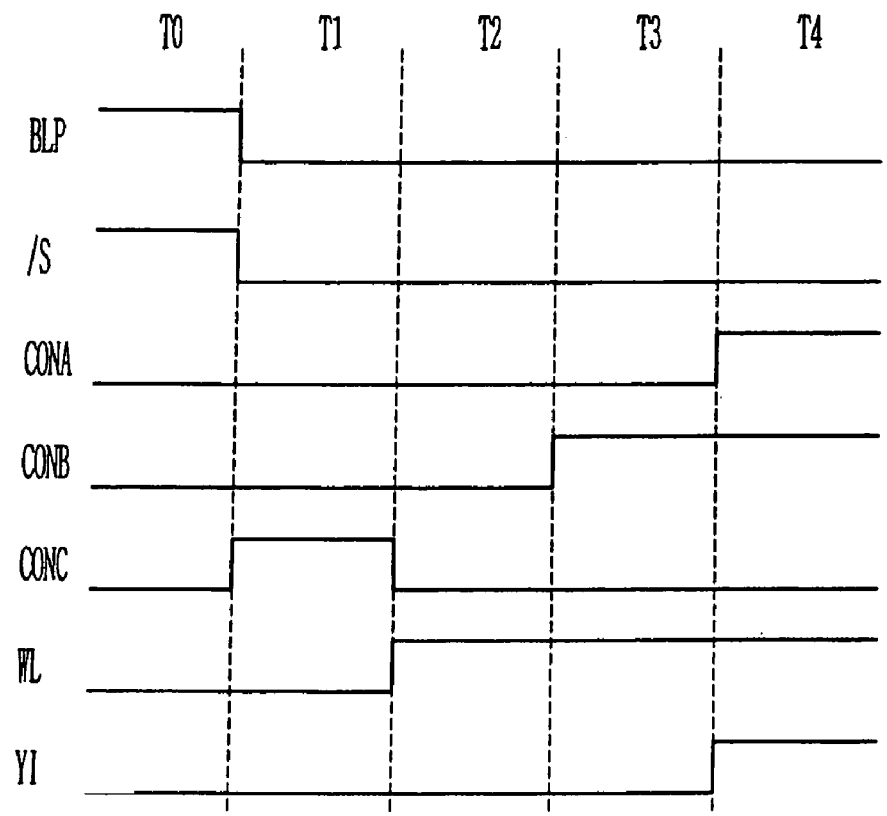
FIG. 3 is a waveform chart for describing operations of the circuit in FIG. 2.
Figure 4A:
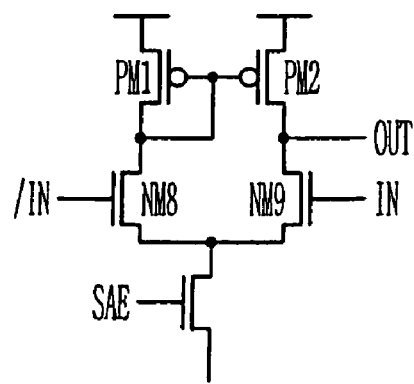
FIGS. 4A and 4B show differential amplifiers for describing operations of the circuit in FIG. 2.
Figure 4B:
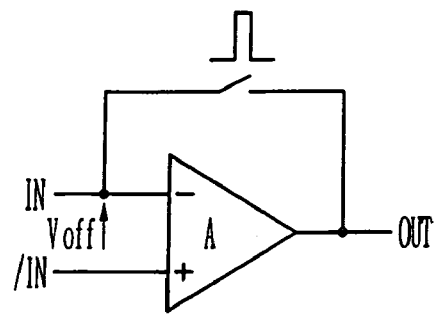
Figure 5:
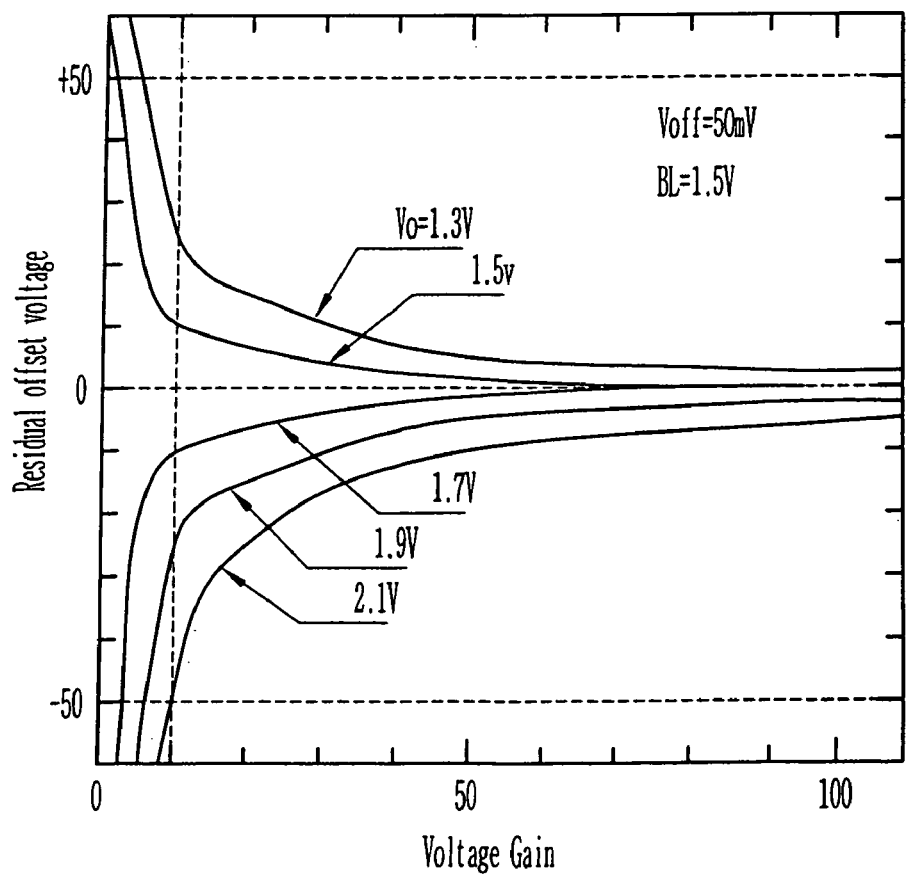
FIG. 5 is a graph for describing a voltage gain of the differential amplifier and the bit-line residual offset according to the output voltage level.
Figure 6:
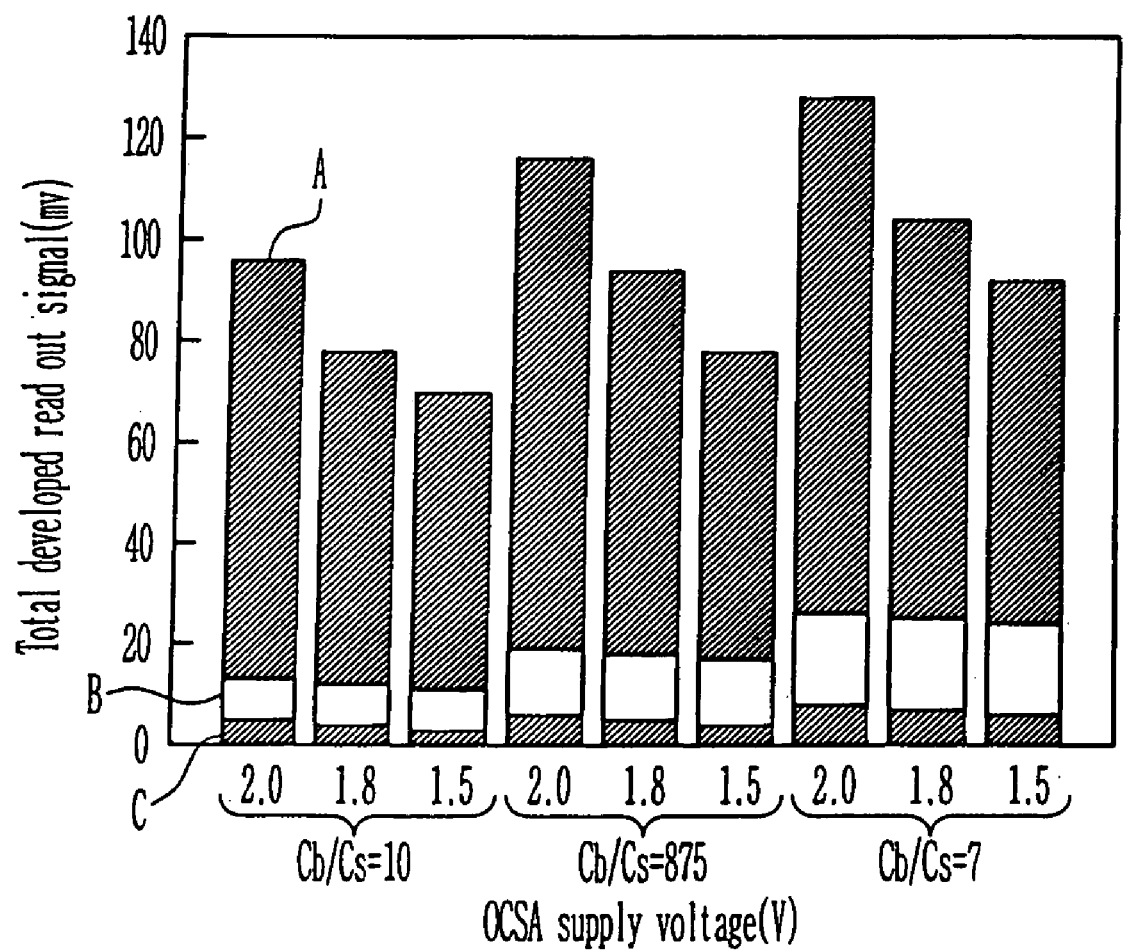
FIG. 6 is a graph for describing components of the signal on the bit-line in the read operation.
Figure 7:
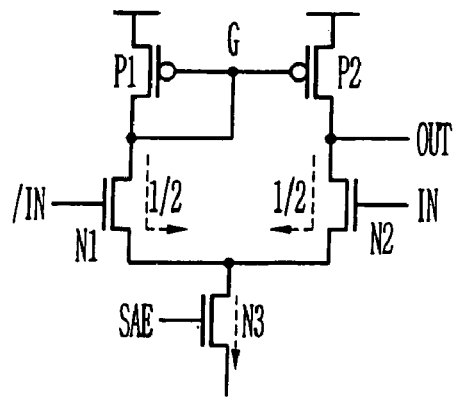
FIG. 7 shows a conventional differential amplifier.
Figure 8:
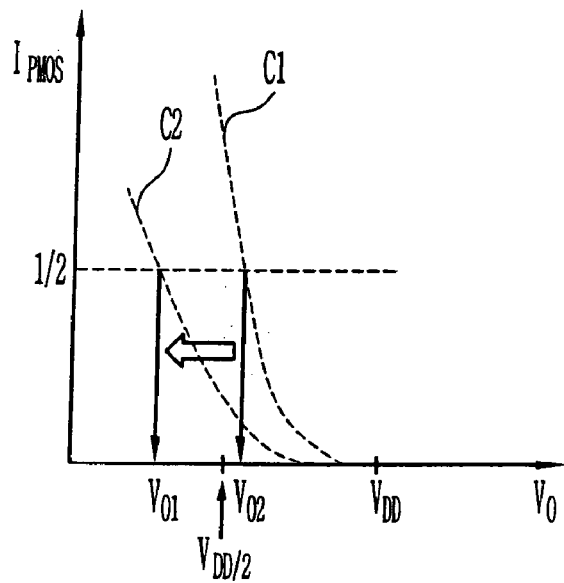
FIG. 8 is a graph for describing a variation on the output voltage depending on the current driving capability of the PMOS transistor in FIG. 7.

The disclosed embodiments will be described in detail with reference to the accompanying drawings, in which like reference numerals are used to identify the same or similar parts.

Figure 9:
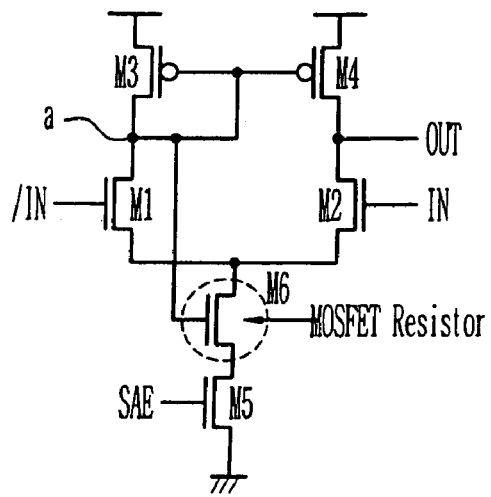
FIG. 9 shows an embodiment of an exemplary differential amplifier.

FIG. 9 shows an embodiment of an exemplary differential amplifier. The differential amplifier of FIG. 9 includes a current mirror including PMOS transistors M3 and M4 and a NMOS transistor, a current source having an NMOS transistor M5, and a MOSFET resistor having an NMOS transistor inserted between the current mirror and the current source.

Because the PMOS transistors M3 and M4 constitute a static voltage source, if characteristics of the NMOS transistors M1 and M2 are identical, the amount of the currents through the transistor M3 and M1 are identical to those through the transistors M4 and M2, respectively. A gate terminal of the NMOS transistor M6 is connected to an output node (a) of the differential amplifier.

If a variation ΔVo on the output voltage OUT is generated due to process variations in a conventional differential amplifier into which the MOSFET resistor M6 has not been inserted, it can be considered the situation that a current of gm3*ΔVo is supplied to the node (a) of the differential amplifier in a design level which assumes no process variations. If such a current is applied to the disclosed differential amplifier, the variation on the output voltage OUT is significantly reduced due to the negative feedback operation in the MOSFET resistor M6. The variation on the voltage at the node (a) can be expressed as the following equation. In other words, if we apply the Krichhoff's current law at the node (a);

$$gm3 \cdot \Delta V_{of} + \frac{1}{2} gm6 \cdot \Delta V_{of} = gm3 \cdot \Delta V_0 \quad \text{[Equation 2]}$$

$$\Delta V_{of} = \frac{1}{1 + \frac{1}{2}\frac{gm6}{gm3}} \cdot \Delta V_0 \quad \text{[Equation 3]}$$

Accordingly, the variation $\Delta V_{of}$ on the output voltage level can be reduced by allowing a trans-conductance gm of the NMOS FET M6 to be larger than the trans-conductance gm of the PMOS FET M3.

Figure 10:
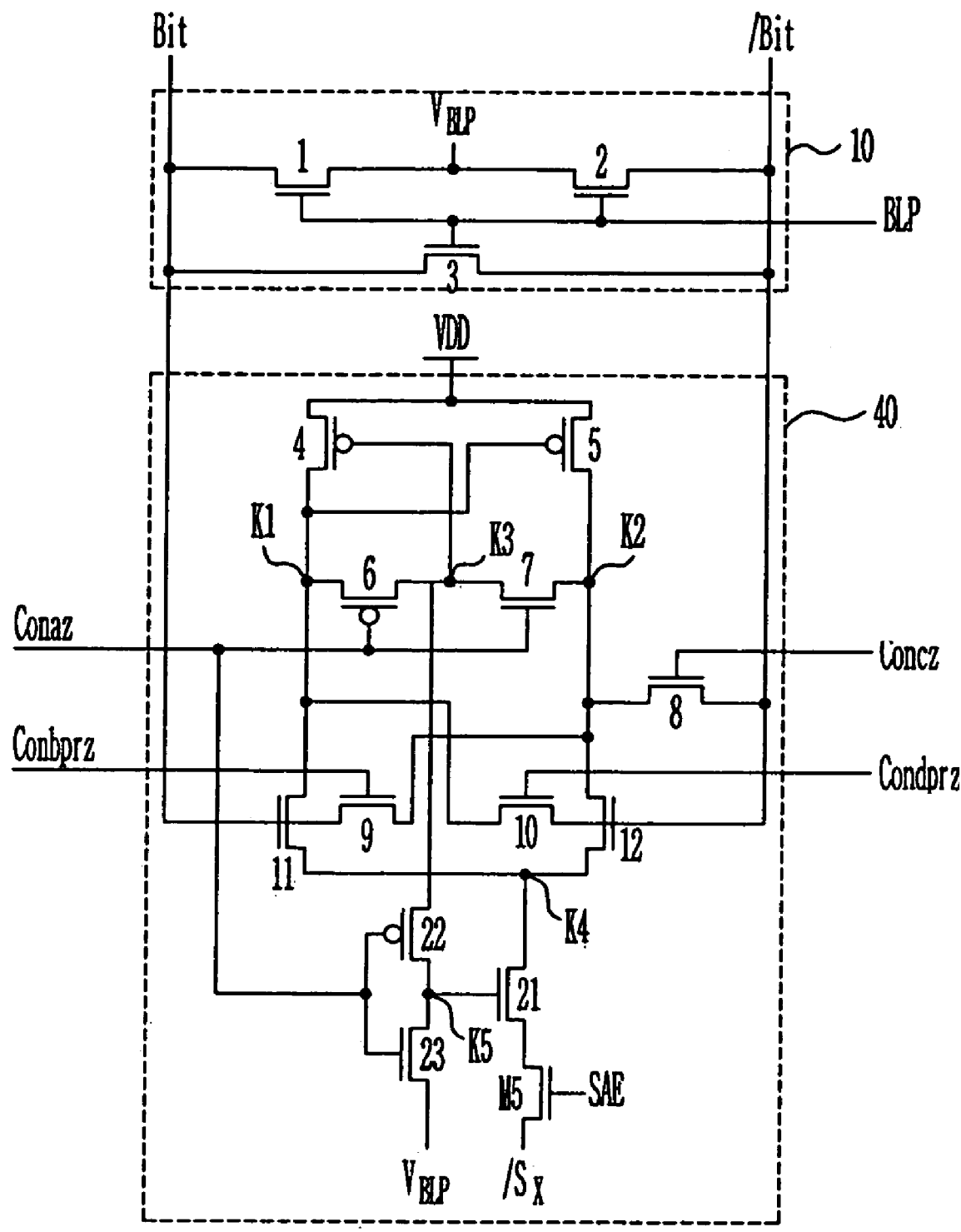
FIG. 10 is a detailed circuit diagram of an embodiment of an exemplary bit-line sense amplifier.

FIG. 10 is a detailed circuit diagram of a embodiment of an exemplary bit-line sense amplifier, which adopts the differential amplifier shown in FIG. 9. The configuration and the operation of the circuit shown in FIG. 10 is described in detail with reference to FIG. 11.

The bit-line sense amplifier of FIG. 10 includes an equalization/precharge control unit 10 to equalize and precharge the pair of bit-lines Bit and /Bit on a constant voltage $V_{BLP}$ depending on the precharge control signal BLP and a sense amplifier 40 to sense and amplify the data on the pair of bit-lines Bit and /Bit.

The equalization/prechage control unit 10 includes an NMOS transistor 3 connected between the pair of bit-lines Bit and /Bit and a pair of NMOS transistors 1 and 2 serially connected between the pair of bit-lines Bit and /Bit. The NMOS transistors 1, 2, and 3 are turned on depending on the precharge control signal BLP, and the bit-line precharge voltage $V_{BLP}$ that is supplied to the connection node in the NMOS transistors 1 and 2.

The sense amplifier 40 includes the PMOS transistors 4, 5, 6, and 22 and NMOS transistors 7, 8, 9, 10, 21, and 23. The PMOS transistor 4 is connected between an internal power voltage source VDD and the node K1, and its gate is connected to the node K3. The PMOS transistor 5 is connected between the internal power voltage source VDD and the node K2, and its gate is connected to the node K1.

The NMOS transistor 9 is connected between the bit-line Bit and the node K2, and its gate receives a control signal Conbprz. The NMOS transistor 10 is connected between the bit-line /Bit and the node K1, and its gate receives a control signal Condprz.

The PMOS transistor 6 is connected between the node K1 and the node K3, and the NMOS transistor 7 is connected between the node K3 and the node K2. The gates of the PMOS transistor 6 and the NMOS transistor 7 receive a control signal Conaz.

The NMOS transistor 11 is connected between the node K1 and the node K4, and its gate is connected to the bit-line Bit. The NMOS transistor 12 is connected between the node K2 and the node K4, and its gate is connected to the bit-line /Bit.

The PMOS transistor 22 is connected between the node K3 and the node K5, and the NMOS transistor 23 is connected between the node K5 and the voltage source (e.g., VBLP). The gates of the PMOS transistor 22 and the NMOS transistor 23 receive a control signal Conaz. The NMOS transistor 21 is connected between the node K4 and the input terminal of the sense amplifier control signal /Sx, and its gate is connected to the node K5.

The NMOS transistor 8 is connected between the node K2 and the bit-line /Bit, and the transistor's gate receives a control signal Concz.

At this point, the PMOS transistors 4 and 5, and the NMOS transistors 11 and 12 are basic components of the sense amplifier 40. The PMOS transistor 6 and the NMOS transistors 7, 8, 9, and 10 are switching elements controlled by the control signals Conaz, Conbprz, Concz, and Condprz, which sequentially modify the amplification method of the sense amplifier 40 to a feedback differential amplification, a normal differential amplification, a positive feedback differential amplification, and a cross-coupled latch type amplification, in that order. Particularly, the NMOS transistor 8 is a switching element, which instantaneously shorts the input and the output of the differential amplifier for an offset compensation of the NMOS transistor 8.

In addition, the NMOS transistors 21 and 23 and the PMOS transistor 22 are used as elements for improving bias stability and increasing a differential amplification gain. Particularly, the NMOS transistor 21 is used as an NMOS FET resistor, which operates in a linear region. The PMOS transistor 22 and the NMOS transistor 23 correspond to switching elements connected to the output of the differential amplifier to improve bias stability when the offset compensation is performed on the NMOS transistor 21, and connected to a constant voltage $V_{BLP}$ after the offset compensation.

Figure 11:
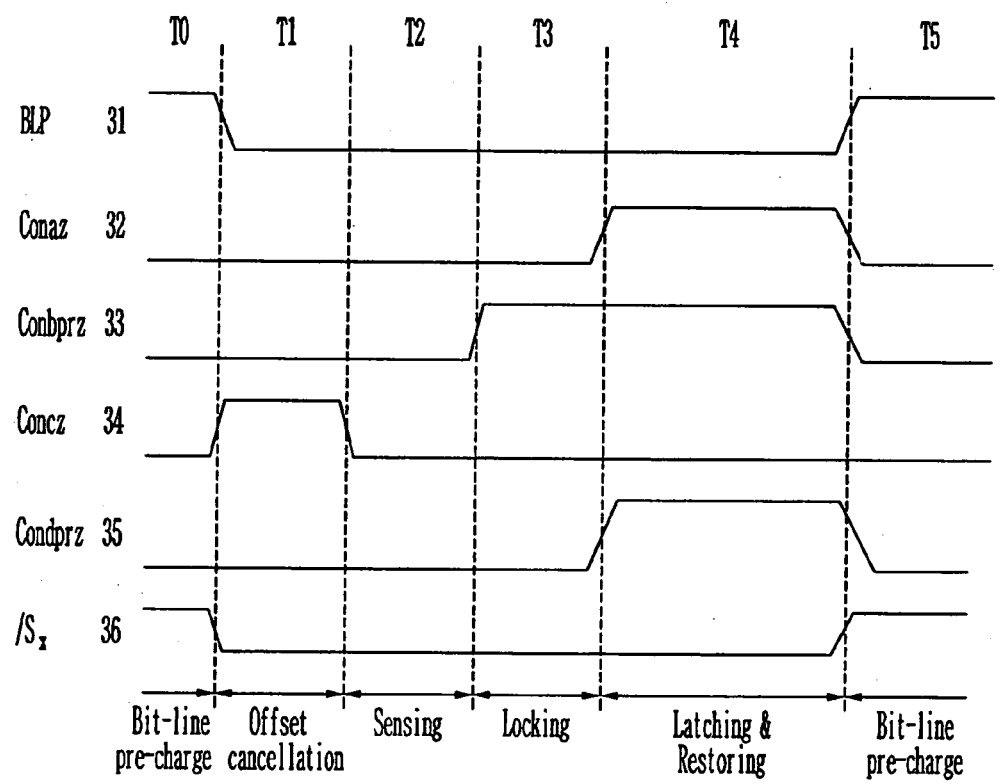
FIG. 11 is a waveform chart for describing operations of the circuit in FIG. 10.

Operations of the sense amplifier having the above configuration will be described with reference to FIG. 11. The time period T0 shown in FIG. 11 corresponds to a preparation stage for driving the sense amplifier. Before a semiconductor memory device performs a read or a write operation, the precharge control signal BLP is enabled at a high level, so that the NMOS transistors 1, 2, and 3 are turned on. As a result, the bit-lines Bit and /Bit are equalized and precharged with the precharge voltage $V_{BLP}$. At this moment, the sense amplifier control signal /Sx is also precharged with the precharge voltage $V_{BLP}$ in a similar manner.

During the time periods T1 to T4, the sense amplifier 40 is enabled. In addition, the sense amplifier 40 is sequentially modified to operate as: a negative feedback differential amplifier in the time period T1 for an offset cancellation, a normal differential amplifier in the time period T2 for a sensing operation, a positive feedback amplifier in the time period T3 for a locking operation, and a cross-coupled latch type amplifier in the time period T4 for a latching and a restoring operations, in that order, depending on the control signals Conaz, Conbprz, Concz, and Condprz. Similarly to the time period T1, the time period T5 corresponds to the time period for a bit-line precharge for the next cycle.

1) Negative Feedback Differential Amplification (T1)

In the time period T1, the precharge control signal BLP is disabled at a low level and the sense amplifier control signal /Sx is enabled at a low level, so that the sense amplifier 40 begins to operate.

At this moment, because the switching control signals Conaz and Conbprz are at a low level, the PMOS transistors 6 and 22 are turned on. As the PMOS transistor 22 is turned on, the gate of the NMOS transistor 21 is connected to a node K1. Therefore, the PMOS transistors 4 and 5 and the NMOS transistors 11, 12, and 21 constitute a differential amplifier. As described above, the NMOS transistor 21 is operated as MOSFET resistor, and connected to the node k1 corresponding to the first output of the differential amplifier.

In addition, since the switching control signal Concz is at a high level, the NMOS transistor 8 is turned on. Therefore, the output node K2 of the differential amplifier is connected to the gate of the NMOS transistor 12 corresponding to the inverted input terminal of the differential amplifier. As a result, the differential amplifier is operated as a negative feedback differential amplifier.

Therefore, the potential in the bit-line /Bit is controlled to be the voltage capable of compensating the offset voltage of the sense amplifier 40. Meanwhile, a variation on the output voltage of the differential amplifier caused by process variations is significantly reduced due to the negative feedback effect of the NMOS transistor, so that the residual offset after the offset compensation is significantly reduced.

2) Normal Differential Amplification (T2)

In the time period T2, the switching control signal Concz is at a low level, the NMOS transistor 8 is turned off, and other switching control signals Conaz, Conbprz, and Condprz remain at a low level. As a result, the sense amplifier 40 constitutes a normal differential amplifier comprising the PMOS transistors 4 and 5 and the NMOS transistors 11, 12, and 21.

At this moment, because the offset voltage of the differential amplifier is already compensated, sensitivity of the differential amplifier is significantly improved, so that even a small signal can be rapidly sensed.

3) Positive Differential Amplification (T3)

In the time period T3, the switching control signal Conbprz is at a high level, the NMOS transistor 9 is turned on, the bit-line Bit corresponding to the non-inverted input terminal of the sense amplifier 40 is connected to the node k2 corresponding to the non-inverted output terminal, and other switching control signals Conaz, Concz, and Condprz remain at a low level. As a result, the sense amplifier 40 operates as a positive feedback differential amplifier including the PMOS transistors 4 and 5 and the NMOS transistors 11, 12, and 21.

Therefore, the data on the bit-line Bit are converted into a larger intensity of signals due to the positive feedback differential amplification effect.

4) Cross-Coupled Latch Type Amplification (T4)

In the time period T4, the switching control signal Conaz is at a high level, the PMOS transistor 6 is turned off, and the NMOS transistors 7 and 23 are turned on. As the NMOS transistor 23 is turned on, the bit-line precharge voltage $V_{BLP}$ is supplied to the gate of the NMOS transistor 21. The switching control signals Conbprz and Condprz come to be at a high level, so that the NMOS transistors 9 and 10 are turned on. The switching control signal Concz remains at a low level, so that the NMOS transistor 8 remains to be turned off. As a result, the sense amplifier 40 operates as a cross-coupled latch. Therefore, the data amplified in the previous stages can be rapidly latched.

Figure 12:
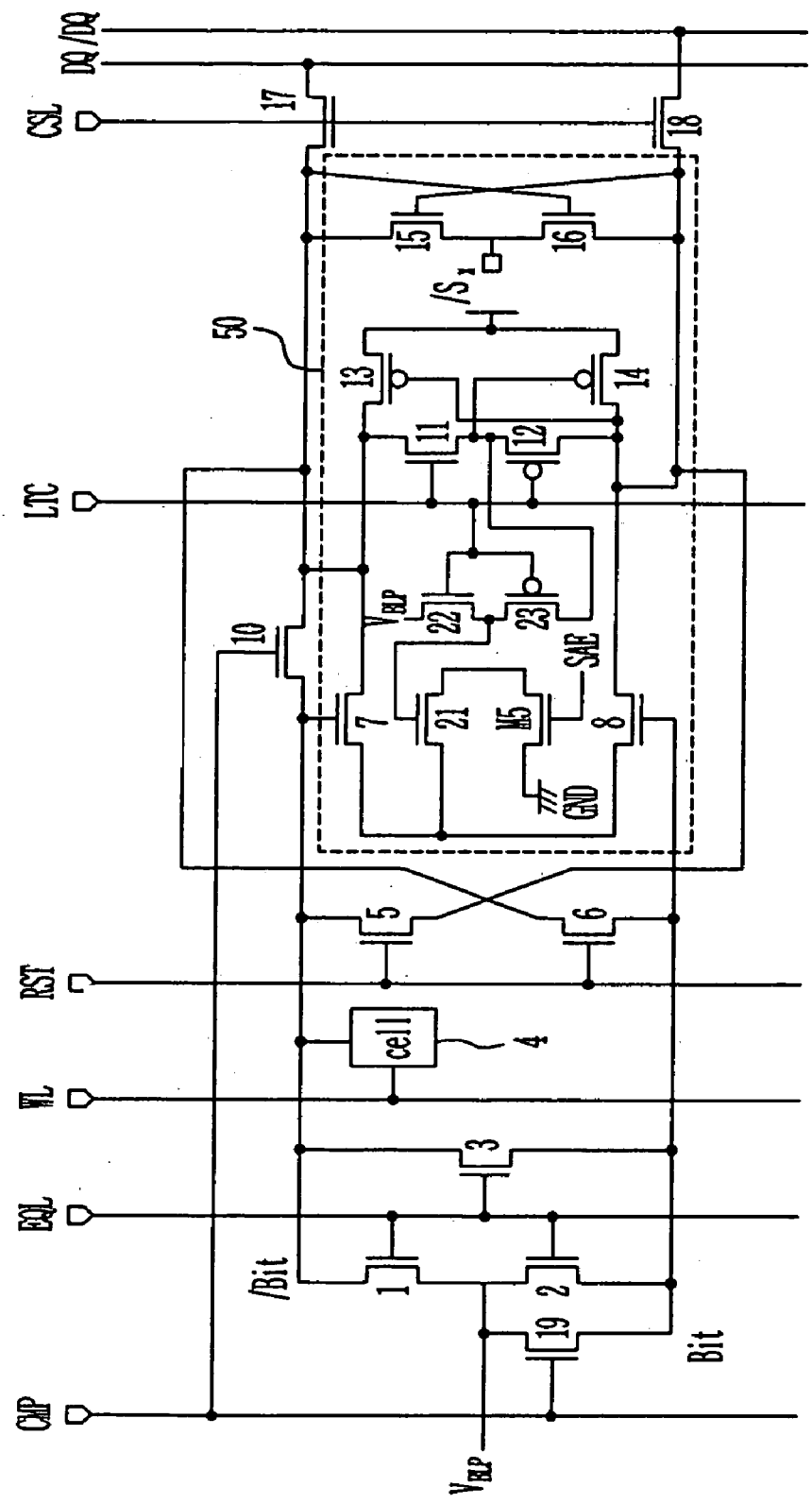
FIG. 12 is a detailed circuit diagram of an alternative embodiment of a bit-line sense amplifier.

FIG. 12 is a detailed circuit diagram showing the bit-line sense amplifier of the second embodiment of the present invention. The circuit in FIG. 12 is arranged in a similar manner to the circuit in FIG. 11. However, since the NMOS transistors 15 and 16 for latching the sensed cell data are separated from the NMOS transistors 7 and 8 which senses the cell data, the circuit in FIG. 12 is shown to be somewhat complicated compared to the circuit in FIG. 11. The transistors 1 to 3, 5 to 8, 10 to 19 function as a bit-line sense amplifier similar to the circuit in FIG. 1, and the control signals CMP, EQL, WL, RST, LTC, /Sx and CSL are used to control the elements included in the bit-line sense amplifier.

Now, each element will be described in more detail. The NMOS transistors 1, 2, and 3 are used to equalize and precharge the pair of bit-lines Bit and /Bit with $V_{BLP}$. The PMOS transistors 13 and 14 and the NMOS transistors 15 and 16 function as a basic cross-coupled latch in the bit-line sense amplifier. The NMOS transistors 7 and 8 directly sense the data on the bit-line. The NMOS transistor 21 is a common current source in the differential amplifier. The NMOS transistor 11 and the PMOS transistor 12 are switching elements to allow the bit-line sense amplifier to be modified to a differential amplifier in an initial step and to a cross-coupled latch type amplifier in the following step. The NMOS transistors 5 and 6 are switching elements to allow the latched data to be restored in the bit-line cell 4. The NMOS transistors 10 and 19 are switching elements to short the input and the output terminals of the differential amplifier in an offset compensation step and applying a reference voltage to the input terminal of the differential amplifier, respectively.

Now, operations of the circuit in FIG. 12 will be described with reference to FIG. 13. Referring to FIG. 13, the time period T0 corresponds to the preparation stage for driving the sense amplifier. Before a semiconductor memory device performs a read or a write operation, the equalization control signal EQL is enabled at a high level, so that the NMOS transistors 1, 2, and 3 are turned on. As a result, the bit-lines Bit and /Bit are equalized and precharged with the precharge voltage $V_{BLP}$.

At this moment, the sense amplifier control signal /Sx is also precharged to the precharge voltage $V_{BLP}$ in a similar manner.

During the time periods T1 to T4 in FIG. 13, the sense amplifier 50 is enabled. In addition, the sense amplifier 50 is modified to a negative feedback differential amplifier in the time period T1 for an offset cancellation, a normal differential amplifier in the time period T2 for the sensing, and a latch in the time period T3 for the latching, in that order, depending on the control signals. The time period T4 corresponds to a restoring period. Similarly to the time period T0, the time period T5 corresponds to a precharging period for the next cycle.

1) Negative Feedback Differential Amplification (T1)

In the time period T1, the equalization control signal EQL is at a low level, so that the sense amplifier 50 is enabled. The control signal CMP is at a high level, so that the NMOS transistor 19 is turned on and the reference voltage VBLP is applied to the bit-line Bit. Because the control signal LTC is at a low level, the PMOS transistors 12 and 23 are turned on, so that the PMOS transistors 13 and 14 and the NMOS transistors 7, 8, and 21 function as a differential amplifier. The NMOS transistor 21 is operated as a MOSFET resistor, and the transistor's gate is connected to the first output node k1 of the differential amplifier through the PMOS transistors 23 and 12.

In addition, because the control signal CMP is at a high level, the NMOS transistor 10 is turned on. As a result, the second output node k2 of the differential amplifier is connected to the gate of the NMOS transistor 7 corresponding to the inverted input terminal of the NMOS transistor 7. As a result, the differential amplifier is operated as a negative feedback differential amplifier.

Accordingly, the potential in the bit-line /Bit is adjusted to a voltage capable of compensating the offset voltage of the sense amplifier 50. Meanwhile, a variation on the input voltage in the differential amplifier due to process variations is significantly reduced by a negative feedback effect of the NMOS transistor N21, so that the residual offset after the compensation is significantly reduced.

2) Normal Differential Amplification

In the time period T2, the control signal CMP is at a low level, so that the NMOS transistor 10 is turned off, and the inverted input of the differential amplifier is separated from the first input. As a result, a normal differential amplifier is formed. The control signal WL is enabled at a high level, so that the data in the cell 4 is loaded on the bit-line /Bit. The data on the bit-line /Bit is sensed and amplified by the sense amplifier 50 having the design of a normal differential amplifier in which an offset compensation has been accomplished.

3) Latch

In the time period T3, the control signal LTC is at a high level, so that the NMOS transistor 11 is turned on. As a result, the PMOS transistors 13 and 15 and the NMOS transistors 15 and 16 function as a latch. Accordingly, the sense amplifier 50 has the shape of a cross-coupled latch.

4) Restoring Time Period

In the time period T4, the control signal RST is at a high level, so that the NMOS transistors 5 and 6 are turned on. As a result, the amplified cell data are rewritten to the bit-line and the cell, again.

According to conventional bit-line sense amplifier for the offset compensation, the offset cancellation step is accomplished in advance of the sensing step. At this point, the sense amplifier has the design of a differential amplifier, and the input and the output terminals are shorted for the offset cancellation for a certain moment. However, the residual offset value after the offset compensation is affected by a voltage gain of the differential amplifier, and a difference between a balanced output level and a voltage level of the input signal. In other words, when the voltage gain of the differential amplifier is not sufficiently large, the residual offset value will not reach 50% of that before the offset compensation.

As described above, according to the disclosed embodiments, a MOSFET resistor is inserted into a common source of the differential amplifier. In addition, a negative feedback effect promotes bias stability. Therefore, it is possible to restrain a variation on the balanced output voltage level in the differential amplifier caused by process variations. As a consequence, it is possible to significantly reduce the residual offset value. In addition, the cell data obtained by such operations can function as a more important factor in low voltage operations in a DRAM.

Although the foregoing description has been made with reference to the preferred embodiments, it is to be understood that changes and modifications of the present invention may be made those of ordinary skill in the art without departing from the spirit and scope of the present invention and appended claims.

What is claimed is:

1. A bit-line sense amplifier, comprising:
   a plurality of switching elements to sequentially modify a sense amplifier to operate as a negative feedback differential amplifier, a normal differential amplifier, a positive feedback differential amplifier, and a cross-coupled latch, in that order, in response to control signals wherein the sense amplifier is adapted to sense data on a pair of bit-lines in a semiconductor memory; and
   a transistor connected between the sense amplifier and a common current source, the transistor having a gate to which one of an output of the sense amplifier and a different power source is supplied in response to one of the control signals;
   wherein the transistor has a resistance which varies depending on the output of the sense amplifier and the different power source.

2. The bit-line sense amplifier according to claim 1,
   wherein the transistor is an NMOS transistor; and
   wherein the resistance is variable depending on the output the sense amplifier when the sense amplifier is operated as the negative feedback differential amplifier, the normal differential amplifier or the positive feedback differential amplifier, whereas the resistance remains constant when the sense amplifier is operated as the cross-coupled latch.

3. A bit-line sense amplifier, comprising:
   a plurality of switching elements to sequentially modify a sense amplifier to operate as a negative feedback differential amplifier, a normal differential amplifier, and a cross-coupled latch depending on control signals, the sense amplifier adapting to sense data on a pair of bit-lines in a semiconductor memory;
   a restore means for rewriting the sensed data on the pair of bit-lines and a selected cell in the semiconductor memory; and
   a transistor connected between the sense amplifier and a common current source, the transistor having a gate to which one of an output of the sense amplifier and a different power source is supplied in response to one of the control signals
   wherein the transistor has a resistance which varies depending on the output of the sense amplifier and the different power source.

4. The bit-line sense amplifier according to claim 3,
   wherein the transistor is an NMOS transistor; and
   wherein the resistance is variable depending on the output of the sense amplifier when the sense amplifier is operated as the negative feedback differential amplifier, the normal differential amplifier or the positive feedback differential amplifier, whereas the resistance remains constant when the sense amplifier is operated as the cross-coupled latch.

* * * * *